(12) United States Patent
Fukudome et al.

(10) Patent No.: US 7,430,107 B2
(45) Date of Patent: Sep. 30, 2008

(54) MONOLITHIC CAPACITOR, CIRCUIT BOARD, AND CIRCUIT MODULE

(75) Inventors: Hidetaka Fukudome, Sabae (JP); Masashi Nishimura, Sabae (JP); Masaaki Taniguchi, Fukui-ken (JP); Yoshio Kawaguchi, Fukui (JP)

(73) Assignee: Murata Manufacturing Co., Ltd, Kyoto (JP)

( * ) Notice: Subject to any disclaimer, the term of this patent is extended or adjusted under 35 U.S.C. 154(b) by 0 days.

(21) Appl. No.: 11/837,059

(22) Filed: Aug. 10, 2007

(65) Prior Publication Data

US 2008/0043400 A1    Feb. 21, 2008

(30) Foreign Application Priority Data

Aug. 21, 2006    (JP)    .............................. 2006-224774
Jul. 5, 2007    (JP)    .............................. 2007-177560

(51) Int. Cl.
*H01G 4/228*    (2006.01)
(52) U.S. Cl. ................. 361/306.3; 361/306.1; 361/303; 361/321.1; 361/321.2; 361/313
(58) Field of Classification Search .............. 361/306.2, 361/306.1, 306.3, 302–305, 311–313, 321.1, 361/321.2, 321.4, 301.2
See application file for complete search history.

(56) References Cited

U.S. PATENT DOCUMENTS

| | | | |
|---|---|---|---|
| 6,034,864 A | 3/2000 | Naito et al. | |
| 6,370,011 B1 | 4/2002 | Naito et al. | |
| 6,381,117 B1 * | 4/2002 | Nakagawa et al. | 361/306.3 |
| 6,414,835 B1 * | 7/2002 | Wolf et al. | 361/302 |
| 6,462,932 B1 | 10/2002 | Naito et al. | |
| 6,496,354 B2 | 12/2002 | Naito et al. | |
| 6,542,352 B1 * | 4/2003 | Devoe et al. | 361/321.2 |
| 6,549,395 B1 | 4/2003 | Naito et al. | |
| 6,608,259 B1 * | 8/2003 | Norskov | 174/261 |
| 7,054,136 B2 | 5/2006 | Ritter et al. | |
| 2006/0049131 A1 | 3/2006 | Satou | |

FOREIGN PATENT DOCUMENTS

| | | |
|---|---|---|
| JP | 11-204372 A | 7/1999 |
| JP | 2004-047983 A | 2/2004 |
| JP | 2005-203623 A | 7/2005 |
| JP | 2006-080248 A | 3/2006 |

\* cited by examiner

*Primary Examiner*—Nguyen T Ha
(74) *Attorney, Agent, or Firm*—Keating & Bennett, LLP

(57) ABSTRACT

A monolithic capacitor includes a laminate of ceramic layers, the laminate having first and second surfaces, at least one pair of first and second internal electrodes, first and second external electrodes disposed on the first surface, third and fourth external electrodes disposed on the second surface, a first via conductor that electrically connects the first external electrode to the first internal electrode and to the third external electrode and that contains a metal oxide, and a second via conductor that electrically connects the second external electrode to the second internal electrode and to the fourth external electrode and that contains a metal oxide, wherein, in each of the first and second via conductors, the metal oxide content at an end on the second surface side is higher than the metal oxide content at a center or at an end on the first surface side.

10 Claims, 16 Drawing Sheets

7 (8)

47 (48)

57 (58)

77 (78)

MONOLITHIC CAPACITOR, CIRCUIT BOARD, AND CIRCUIT MODULE

BACKGROUND OF THE INVENTION

1. Field of the Invention

The present invention relates to monolithic capacitors. More specifically, the present invention relates to monolithic capacitors including ceramic layers and at least one pair of internal electrodes opposing each other with one of the ceramic layers therebetween, circuit boards, and circuit modules.

2. Description of the Related Art

In a power supply circuit, when voltage fluctuation increases in a power supply line, because of the impedances present in the power supply line and a ground, the operation of a circuit to be driven may become unstable, interference between circuits may occur by way of the power supply circuit, or oscillation may occur. Consequently, a decoupling capacitor is usually connected between the power supply line and the ground. The decoupling capacitor reduces the alternating current impedance between the power supply line and the ground, and suppresses fluctuation of the power supply voltage and interference between circuits.

Recently, in communication devices, such as mobile phones, and information-processing devices, such as personal computers, in order to process a large amount of information, the signal speed has been increasing. Accordingly, the clock frequency of semiconductor integrated circuits (hereinafter, which may be abbreviated as "ICs") to be used has been increasing. As a result, noise with a high harmonic content is easily generated. Thus, it is necessary to provide stronger decoupling in IC power supply circuits.

In order to enhance the decoupling effect, it is effective to use a decoupling capacitor having an excellent impedance frequency characteristic. Examples of such a decoupling capacitor include monolithic ceramic capacitors. Monolithic ceramic capacitors have a low equivalent series inductance (ESL), and thus have a high noise absorption effect over a wider frequency band than electrolytic capacitors.

FIG. 16 is a cross-sectional view showing a structure of a monolithic capacitor 131 disclosed in Japanese Unexamined Patent Application Publication No. 11-204372 in which ESL can be reduced. In the monolithic capacitor 131, as shown in FIG. 16, both first external terminals 138 and second external terminals 139 are disposed on a principal surface 137 of a capacitor body 135. A first internal electrode 133 located in the capacitor body 135 is connected to a corresponding external terminal 138 by a corresponding first via-hole connecting portion 140, and a plurality of first internal electrodes 133 are connected to each other by first via-hole connecting portions 140. A second internal electrode 134 is connected to a corresponding second external terminal 139 by a corresponding second via-hole connecting portion 141, and a plurality of second internal electrodes 134 are connected to each other by second via-hole connecting portions 141. The first via-hole connecting portions 140 and the second via-hole connecting portions 141 are alternately arranged.

In the monolithic capacitor 131, currents flowing through the internal electrodes 133 and 134 flow a short distance and are directed in various directions, and currents flowing through the via-hole connecting portions 140 and 141 are directed opposite to each other. Thus, the magnetic fluxes cancel each other, and ESL is reduced.

In the monolithic ceramic capacitor used as the decoupling capacitor, in addition to reduction in ESL, it is required to control the equivalent series resistance (ESR). The reason for this is to prevent the fact that, when many capacitors are connected in parallel in the periphery of an IC, the impedance of the IC is extremely decreased in the vicinity of the resonant frequency of the IC, which may cause ringing, resulting in a disturbance of the signal waveform in the IC.

A multilayer ceramic capacitor in which controlled ESR is achieved is disclosed in Japanese Unexamined Patent Application Publication No. 2004-47983. In the multilayer ceramic capacitor, terminal vias are composed of ruthenium oxide which is a resistive material, and correspond to the via-hole connecting portions 140 and 141 in the monolithic capacitor shown in FIG. 16. Thereby, the resistance (impedance) at the terminal vias is increased, which suppresses the disturbance of signal waveform due to the occurrence of ringing.

However, in the multilayer ceramic capacitor described above, since the resistance at the terminal vias becomes excessively high, there is a delay in an activation of the IC, which is a problem. When the multilayer ceramic capacitor is used as a decoupling capacitor, the multilayer ceramic capacitor not only prevents the interference of signals from other circuits but also supplies a complementary electric power to the IC because an electric power may be deficient during fluctuation of the power supply voltage. Consequently, when the resistance of the terminal vias becomes excessively high, electric power is prevented from being rapidly supplied from the multilayer ceramic capacitor to the IC, resulting in a delay in an activation of the IC. Furthermore, when the resistive component is present entirely in the terminal vias, the resistance of the terminal vias easily fluctuates under the influence of sintering shrinkage of the terminal vias, etc. Thus, it is difficult to adjust the resistance of the terminal vias, which is also a problem.

SUMMARY OF THE INVENTION

In order to overcome the problems described above, preferred embodiments of the present invention provide a monolithic capacitor which can suppress the occurrence of ringing and which can rapidly supply electric power to an IC even when the power supply voltage fluctuates, a circuit board including the monolithic capacitor, and a circuit module including the circuit board.

According to a preferred embodiment of the present invention, a monolithic capacitor includes a laminate including a plurality of ceramic layers. The laminate has a first surface and a second surface opposing the first surface. The monolithic capacitor includes at least one pair of first and second internal electrodes opposing each other with one of the ceramic layers disposed therebetween. The monolithic capacitor includes a first external electrode and a second external electrode disposed on the first surface. The monolithic capacitor includes a third external electrode and a fourth external electrode disposed on the second surface. The monolithic capacitor includes a first via conductor that electrically connects the first external electrode to the first internal electrode and to the third external electrode, that extends between the first surface and the second surface, and that is made of a material containing a metal oxide, wherein the metal oxide content at an end on the second surface side of the first via conductor is higher than at least one of the metal oxide content at a center and the metal oxide content at an end on the first surface side of the first via conductor. The monolithic capacitor includes a second via conductor that electrically connects the second external electrode to the second internal electrode and to the fourth external electrode, that extends between the first surface and the second surface, and that is made of a material containing a metal oxide, wherein the metal oxide content at an end on the second surface side of the second via conductor is higher than at least one of the metal oxide content at a center and the metal oxide content at an end on the first surface side of the second via conductor.

In the monolithic capacitor having the structure described above, in each of the first via conductor and the second via conductor, the metal oxide content at the end on the second surface side is higher than at least one of the metal oxide content at the end on the first surface side and the metal oxide content at the center. Consequently, in each of the first via conductor and the second via conductor, the resistance at the end on the second surface side is relatively high, and at least one of the resistance at the end on the first surface side and the resistance at the center is relatively low. Therefore, because of the effect of the end on the second surface side of each of the first via conductor and the second via conductor, ringing does not easily occur. Furthermore, current easily flows at least one of at the end on the first surface side and at the center of each of the first via conductor and the second via conductor, and electric power can be rapidly supplied to an IC even when the power supply voltage fluctuates. Furthermore, since the resistance of each of the first via conductor and the second via conductor is partially increased, in comparison with the case where the resistance of each of the first via conductor and the second via conductor is entirely increased, the fluctuation in the resistance of each of the first via conductor and the second via conductor does not easily occur. That is, the resistance of each of the first via conductor and the second via conductor can be easily set.

Preferably, in the first via conductor, the metal oxide content at the end on the second surface side is higher than the metal oxide content at the center and at the end on the first surface side, and in the second via conductor, the metal oxide content at the end on the second surface side is higher than the metal oxide content at the center and at the end on the first surface side.

In such a structure, in each of the first via conductor and the secondvia conductor, the resistance at the end on the second surface side is relatively high, and the resistance in other portions is relatively low. Consequently, current easily flows through the end at the first surface side of each of the first via conductor and the second via conductor. As a result, electric power can be more rapidly supplied to the IC even when the power supply voltage fluctuates.

Preferably, the first via conductor has a shape in which the cross-sectional area increases from the end on the second surface side toward the end on the first surface side, and the second via conductor has a shape in which the cross-sectional area increases from the end on the second surface side toward the end on the first surface side.

In such a structure, the resistance increases from the end on the first surface side toward the end on the second surface side in each of the first via conductor and the second via conductor. Consequently, it is possible to further increase the difference in the resistance between at the end on the first surface side and at the end on the second surface side.

Preferably, the laminate includes a capacitance layer that contributes to formation of capacitance and non-capacitance layers that do not contribute to formation of capacitance, the capacitance layer being sandwiched between the non-capacitance layers in the lamination direction, and the end on the second surface side of the first via conductor and the end on the second surface side of the second via conductor respectively correspond to a portion of the first via conductor passing through the non-capacitance layer on the second surface side and a portion of the second via conductor passing through the non-capacitance layer on the second surface side.

In such a structure, in each of the first via conductor and the secondvia conductor, the resistance of the portion passing through the non-capacitance layer on the second surface side is relatively high, and the resistance of the portions passing through the non-capacitance layer on the first surface side and the capacitance layer is relatively low. Electric power from the capacitor is supplied through the portions of each of the first via conductor and the second via conductor that pass through the non-capacitance layer on the first surface side and the capacitance layer. Since the resistance of these portions is decreased, electric power can be more rapidly supplied to the IC.

Preferably, in the first via conductor, the metal oxide content at the end on the first surface side is higher than the metal oxide content at the center, and in the second via conductor, the metal oxide content at the end on the first surface side is higher than the metal oxide content at the center.

In such a structure, in each of the first via conductor and the second via conductor, the resistance at both ends is relatively higher than the resistance at the center. That is, each of the first via conductor and the second via conductor has a structure which is substantially symmetrical with respect to the center. As a result, it is not necessary to use marking for distinguishing the first surface from the second surface of the monolithic capacitor.

Preferably, the first via conductor has a shape in which the cross-sectional area increases from each of the end at the first surface side and the end at the second surface side toward the center, and the second via conductor has a shape in which the cross-sectional area increases from each of the end at the first surface side and the end at the second surface side toward the center.

In such a structure, the resistance decreases from each of the end at the first surface and the end at the second surface toward the center in each of the first via conductor and the second via conductor. Consequently, it is possible to further increase the difference in the resistance between at each of the end on the first surface side and the end on the second surface side and at the center.

Preferably, the laminate includes a capacitance layer that contributes to formation of capacitance and non-capacitance layers that do not contribute to formation of capacitance, the capacitance layer being sandwiched between the non-capacitance layers in the lamination direction, and the center of the first via conductor and the center of the second via conductor respectively correspond to a portion of the first via conductor passing through the capacitance layer and a portion of the second via conductor passing through the capacitance layer.

In such a structure, in each of the first via conductor and the second via conductor, the resistance of the portions passing through the non-capacitance layers is relatively high, and the resistance of the portion passing through the capacitance layer is relatively low. Electric power from the capacitor is supplied through the portions of each of the first via conductor and the second via conductor that pass through the non-capacitance layer on the first surface side and the capacitance layer. Since the resistance of the portion passing through the capacitance layer is decreased, electric power can be more rapidly supplied to the IC.

Preferably, the metal oxide contained in each of the first via conductor and the second via conductor is a ceramic that belongs to the same material system as that of a ceramic constituting the ceramic layers.

In such a structure, adhesion is improved between each of the first via conductor and the second via conductor and the ceramic layers.

According to another preferred embodiment of the present invention, a circuit board includes a substrate made of an insulating material, a plurality of input terminals disposed on a surface of the substrate, a plurality of lines electrically connected to the input terminals, and any of monolithic capacitors according to the preferred embodiments of the present invention described above, wherein the monolithic capacitor is mounted on the substrate with the plurality of lines being electrically connected to the third external electrode and the fourth external electrode.

According to another preferred embodiment of the present invention, a circuit module includes the circuit board described above and a semiconductor integrated circuit mounted on the circuit board, wherein the monolithic capacitor and the semiconductor integrated circuit are electrically connected to each other through the first external electrode and the second external electrode.

According to the preferred embodiments of the present invention, the resistance at the end on the second surface side of each of the first via conductor and the second via conductor is relatively high, and at least one of the resistance at the end on the first surface side and the resistance at the center of each of the first via conductor and the second via conductor is relatively low. Consequently, ringing does not easily occur, and electric power can be rapidly supplied to an IC even when the power supply voltage fluctuates. Furthermore, since the resistance of each of the first via conductor and the second via conductor is partially increased, in comparison with the case where the resistance of each of the first via conductor and the second via conductor is entirely increased, the fluctuation in the resistance of each of the first via conductor and the second via conductor does not easily occur. That is, the resistance of each of the first via conductor and the second via conductor can be easily set.

Other features, elements, steps, characteristics and advantages of the present invention will become more apparent from the following detailed description of preferred embodiments of the present invention with reference to the attached drawings.

DETAILED DESCRIPTION OF PREFERRED EMBODIMENTS

Figure 1:
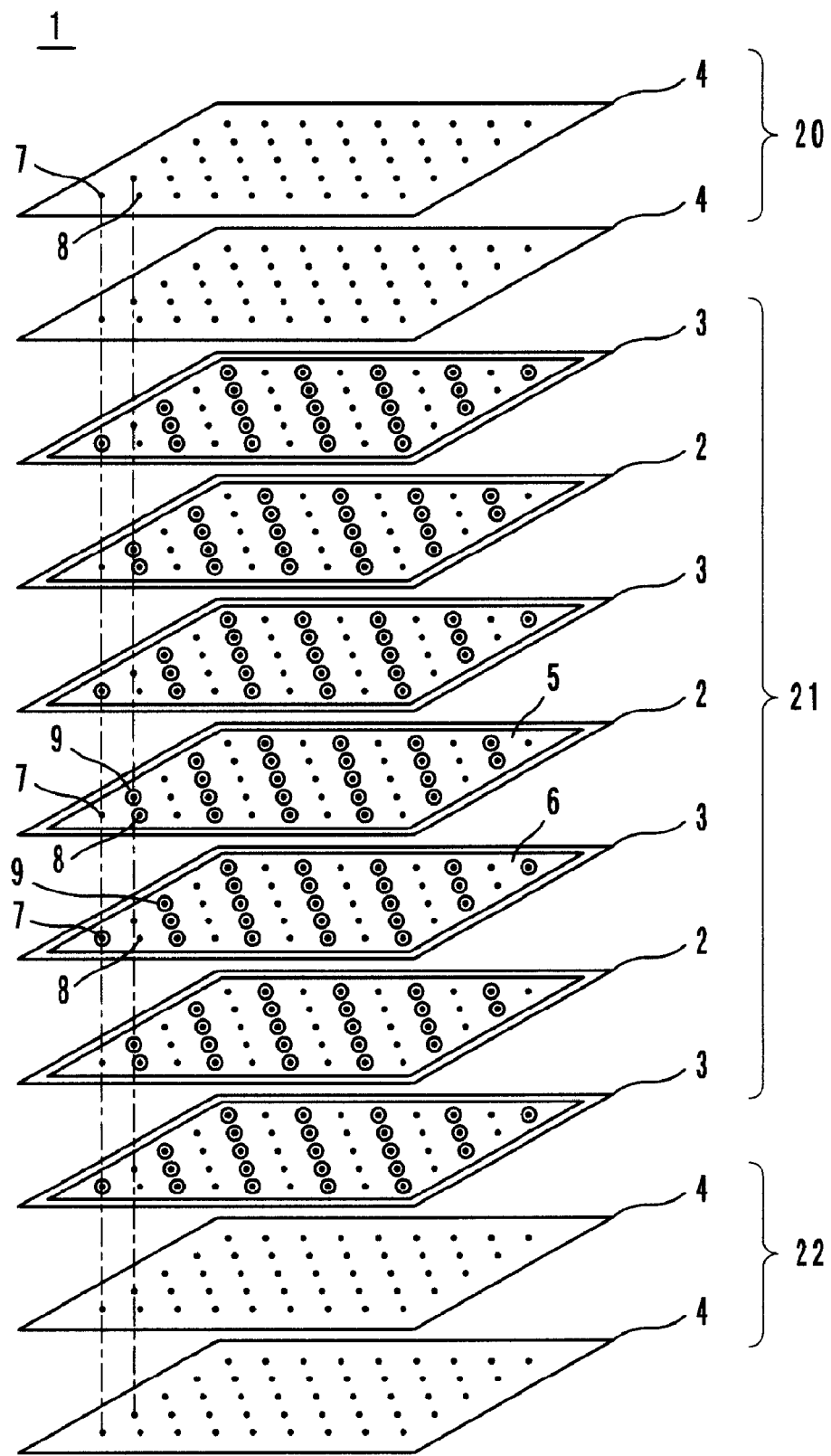
FIG. 1 is an exploded perspective view of a monolithic capacitor according to a first preferred embodiment of the present invention.

Monolithic capacitors, circuit boards, and circuit modules according to preferred embodiments of the present invention will be described below with reference to the attached drawings. In the drawings of first to tenth preferred embodiments which will be described below, the same components and portions are designated by the same reference numerals, and a duplicate explanation thereof will be omitted.

First Preferred Embodiment

Figure 2:
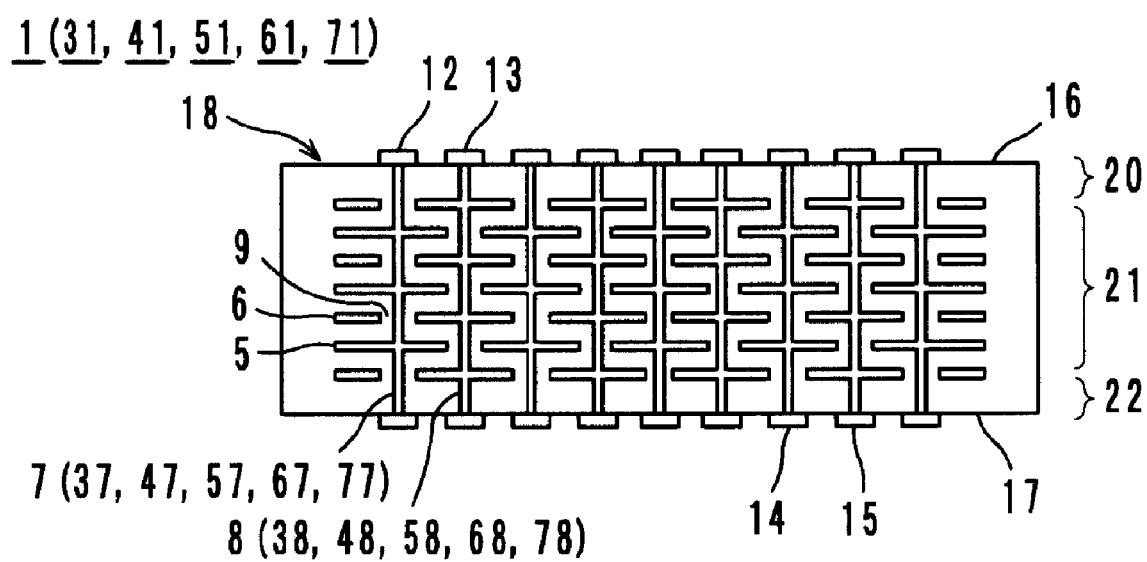
FIG. 2 is a cross-sectional view showing a structure of the monolithic capacitor shown in FIG. 1.

FIG. 1 is an exploded perspective view of a monolithic capacitor 1 according to a first preferred embodiment of the present invention. FIG. 2 is a cross-sectional view showing a structure of the monolithic capacitor 1. As shown in FIG. 1, the monolithic capacitor 1 includes first ceramic layers 2, second ceramic layers 3, and third ceramic layers 4. The first ceramic layers 2 and the second ceramic layers 3 are alternately disposed. The third ceramic layers 4 are disposed so as to sandwich, in the lamination direction, a laminate in which the first ceramic layers 2 and the second ceramic layers 3 are alternately disposed. The first ceramic layers 2, the second ceramic layers 3, and the third ceramic layers 4 constitute a laminate 18 shown in FIG. 2. First external electrodes 12 and second external electrodes 13 are disposed on an upper surface 16 of the laminate 18, and third external electrodes 14 and fourth external electrodes 15 are disposed on a lower surface 17.

The first ceramic layer 2, the second ceramic layer 3, and the third ceramic layers 4 are preferably dielectric ceramic layers containing $BaTiO_3$, $CaTiO_3$, $SrTiO_3$, $CaZrO_3$, or the like as a main component. A Mn compound, a Fe compound, a Cr compound, a Co compound, a Ni compound, or the like may be added, as a secondary component, to the dielectric ceramic layers containing the main component described above. Preferably, the first ceramic layer 2, the second ceramic layer 3, and the third ceramic layer 4 each have a thickness of, for example, about 1.0 µm to about 5.0 µm after firing. A first internal electrode 5 is disposed on a principal surface of each first ceramic layer 2, and first via conductors 7 and second via conductors 8 are arranged so as to penetrate the first ceramic layers 2 in the lamination direction. A second internal electrode 6 is disposed on a principal surface of each second ceramic layer 3, and the first via conductors 7 and the second via conductors 8 are disposed so as to penetrate the second ceramic layers 3 in the lamination direction. The first via conductors 7 and the second via conductors 8 are disposed so as to penetrate the third ceramic layers 4 in the lamination direction. The principal surface of each third ceramic layer 4 is not provided with a first internal electrode 5 or a second internal electrode 6.

The first internal electrodes 5 and the second internal electrodes 6 are each made of a metal, such as Ni, Cu, Ag, Pd, a Ag—Pd alloy, or Au, and constitute electrodes of capacitors. Specifically, a first internal electrode 5 opposes a second internal electrode 6 with a first ceramic layer 2 or a second ceramic layer 3 therebetween to constitute a capacitor. Preferably, the first internal electrode 5 and the second internal electrode 6 each have a thickness of, for example, about 0.8 μm to about 1.2 μm after firing.

As described above, the first internal electrode 5 and the second internal electrode 6 are disposed on each first ceramic layer 2 and each second ceramic layer 3, respectively. Thereby, as shown in FIG. 1, a capacitance layer 21 that contributes to formation of capacitance is provided. Non-capacitance layers 20 and 22 that do not contribute to formation of capacitance are respectively disposed on the upper and lower surfaces of the capacitance layer 21 in the lamination direction.

The first via conductors 7 and the second via conductors 8 are each made of a material obtained by mixing a metal oxide with a metal, such as Ni, Cu, Ag, Pd, a Ag—Pd alloy, or Au, and disposed so as to extend between the upper surface 16 and the lower surface 17 as shown in FIG. 2. Each first via conductor 7 electrically connects the corresponding first external electrode 12 to the first internal electrodes 5 and to the corresponding third external electrode 14. Each second via conductor 8 electrically connects the corresponding second external electrode 13 to the second internal electrodes 6 and to the corresponding fourth external electrode 15. As shown in FIG. 1, the first via conductors 7 are formed like islands in the first ceramic layers 2, the second ceramic layers 3, and the third ceramic layers 4. Examples of the metal oxide include glass, $RuO_2$, an In—Sn compound oxide (ITO), a La—Cu compound oxide, a Sr—Fe compound oxide, a Ca—Sr—Ru compound oxide, dielectric ceramics, such as $BaTiO_3$, and metal oxides, such as $Al_2O_3$, $TiO_2$, $ZrO_2$, and $ZnO_2$. Note that when the first internal electrode 5 and the second internal electrode 6 are each made of Ni or a Ni alloy, use of an In—Sn compound oxide (ITO), a La—Cu compound oxide, a Sr—Fe compound oxide, or a Ca—Sr—Ru compound oxide is preferable. These compound oxides are highly reactive with Ni, and can improve bondability between the first via conductors 7 and the first internal electrodes 5 and between the second via conductors 8 and the second internal electrodes 6. The first via conductors 7 are isolated from the second internal electrodes 6. For that purpose, circular or substantially circular openings 9 are provided in the second internal electrodes 6 at positions corresponding to the first via conductors 7. As shown in FIG. 1, the second via conductors 8 are formed like islands in the first ceramic layers 2, the second ceramic layers 3, and the third ceramic layers 4 so as not to overlap the first via conductors 7. The second via conductors 8 are isolated from the first internal electrodes 5. For that purpose, circular or substantially circular openings 9 are provided in the first internal electrodes 5 at positions corresponding to the second via conductors 8.

The metal constituting each of the first via conductor 7 and the second via conductor 8 preferably includes, as a main component, the same metal as that constituting each of the first internal electrode and the second internal electrode. Furthermore, the metal oxide constituting each of the first via conductor 7 and the second via conductor 8 is preferably a ceramic that belongs to the same material system as the ceramic constituting each of the first ceramic layer 2, the second ceramic layer 3, and the third ceramic layer 4, and more preferably the same ceramic as the ceramic constituting each of the first ceramic layer 2, the second ceramic layer 3, and the third ceramic layer 4. The term "same material system" means a material system containing the same main component. In the present specification, the term "main component" means a component that accounts for 50% by weight or more of the all components.

Figure 3:
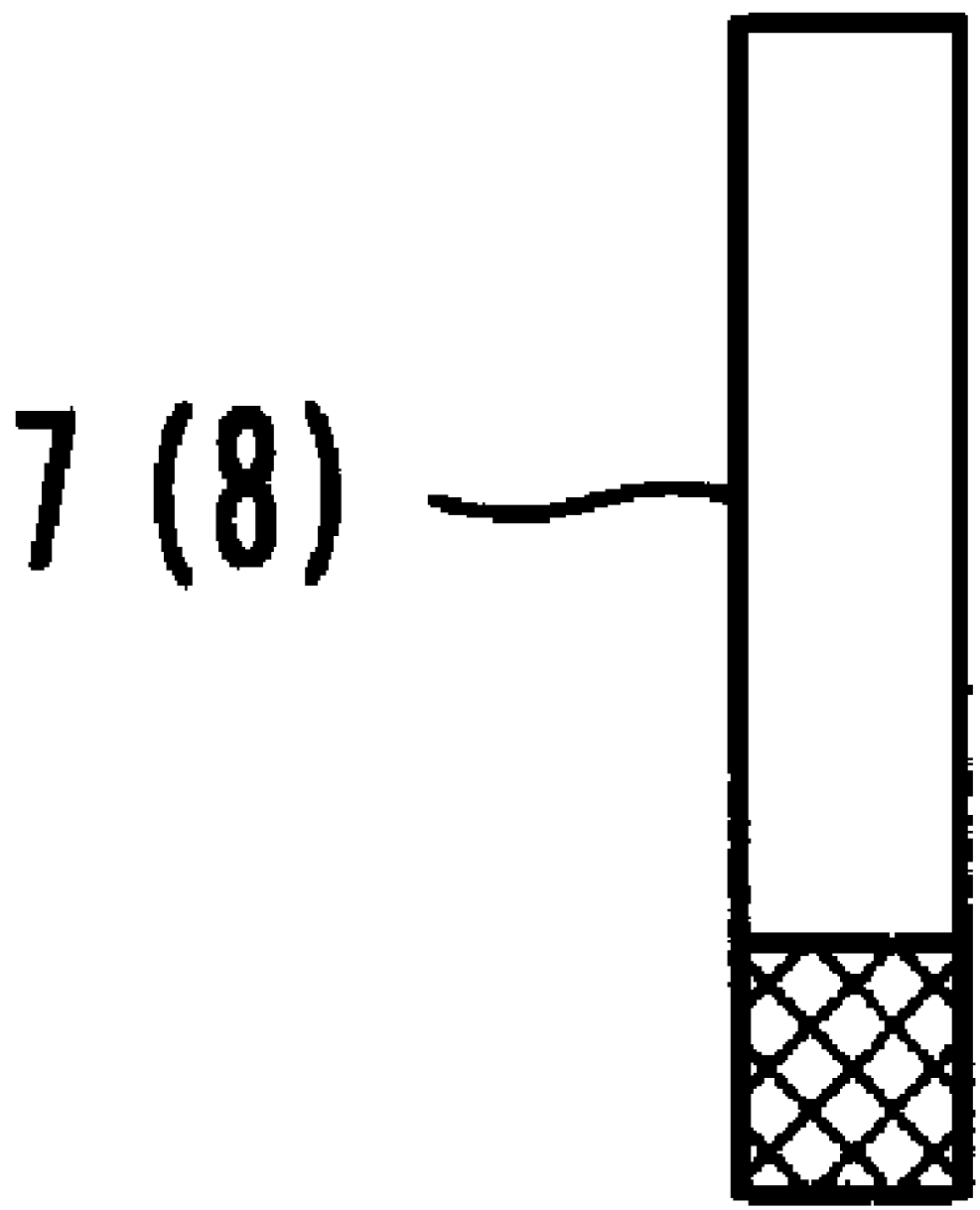
FIG. 3 is a schematic diagram showing the metal oxide content in each portion of each of the first via conductor and the second via conductor in the first preferred embodiment of the present invention.

In each of the first via conductor 7 and the second via conductor 8, the metal oxide content differs depending on the position of each of the first via conductor 7 and the second via conductor 8 in the lamination direction. FIG. 3 is a schematic diagram showing the metal oxide content in each portion of each of the first via conductor 7 and the second via conductor 8. In each of FIGS. 3 to 8, a portion with denser hatching indicates a portion with a higher metal oxide content. As shown in FIG. 3, in each of the first via conductor 7 and the second via conductor 8, the metal oxide content at the end on the lower surface 17 side is higher than the metal oxide content in other portions. Note that, in each of the first via conductor 7 and the second via conductor 8, the end on the lower surface side 17 corresponds to a portion passing through the non-capacitance layer 22.

The diameter of each of the first via conductor 7 and the second via conductor 8 after firing is preferably about 50 μm to about 150 μm, for example. If the diameter is less than about 50 μm, in some cases, there may be a difficulty in filling via-holes with paste, and connection between the layers may not be performed reliably. If the diameter exceeds about 150 μm, in some cases, moisture resistance may be degraded. For practical purposes, the length of each of the first via conductor 7 and the second via conductor 8 after firing preferably is, for example, about 100 μm to about 1,000 μm.

The first external electrode 12 and the second external electrode 13 are disposed on the upper surface 16 and connected to the corresponding first via conductor 7 and second via conductor 8 respectively. The third external electrode 14 and the fourth external electrode 15 are disposed on the lower surface 17 and connected to the corresponding first via conductor 7 and second via conductor 8, respectively. Each of the first external electrodes 12, the second external electrodes 13, the third external electrodes 14, and the fourth external electrodes 15 is preferably made of Cu, Ni, Ag, Pd, an Ag—Pd alloy, Au, or the like. When solder mounting is performed, preferably, each of the external electrodes is made of Cu, and Ni plating and Sn plating are further performed thereon in that order. When conductive adhesive mounting is performed, preferably, each of the external electrodes is made of Ag, Pd, or a Ag—Pd alloy. When the monolithic capacitor is embedded in a resin substrate for mounting, preferably, Cu plating is performed on the surface of each of the external electrodes. The thickness of each of the first external electrodes 12, the second external electrodes 13, the third external electrodes 14, and the fourth external electrodes 15 after firing is preferably 20 to 60 μm.

In the monolithic capacitor 1 having the structure described above, in each of the first via conductor 7 and the second via conductor 8, the metal oxide content at the end on the lower surface 17 side is higher than the metal oxide content in other portions. Consequently, the occurrence of ringing can be suppressed, and electric power can be rapidly supplied to an IC even when the power supply voltage fluctuates.

The metal oxide content in each portion of a via conductor influences the resistance at each portion of the via conductor. Specifically, in a portion having a high metal oxide content, the resistance is high, and in a portion having a low metal oxide content, the resistance is low. Using such a characteristic, in this preferred embodiment, by setting the metal oxide content at the end on the lower surface 17 side of each of the first via conductor 7 and the second via conductor 8 to be higher than the metal oxide content in other portions, the resistance at the end on the lower surface 17 side of each of the first via conductor 7 and the second via conductor 8 is set to be higher than the resistance of other portions of each of the first via conductor 7 and the second via conductor 8. As a result, current does not easily flow through the end on the lower surface 17 side, thus suppressing the occurrence of ringing. By decreasing the resistance in portions other than the end, current easily flows through these portions, and electric power can be rapidly supplied to an IC through the other end. Consequently, when the first external electrodes 12 and the second external electrodes 13 are connected to an IC and a power supply voltage or a ground voltage is applied to the third external electrodes 14 or the fourth external electrodes 15, ringing can be suppressed as well as electric power can be rapidly supplied to the IC during the fluctuation of the power supply voltage.

Furthermore, in the monolithic capacitor 1, in each of the first via conductor 7 and the second via conductor 8, the end on the lower surface 17 side corresponds to a portion passing through the non-capacitance layer 22. Consequently, in each of the first via conductor 7 and the second via conductor 8, the resistance of the portions passing through the non-capacitance layer 20 and the capacitance layer 21 is relatively low. During the supply of electric power to the IC, the current flowing into the IC and the current flowing out of the IC flow through the portions passing through the non-capacitance layer 20 and the capacitance layer 21 in each of the first via conductor 7 and the second via conductor 8. Accordingly, because the resistance is low in these portions, electric power can be rapidly supplied to the IC.

Furthermore, since the metal oxide is mixed into the first via conductor 7 and the second via conductor 8, adhesion with the first ceramic layer 2, the second ceramic layer 3, and the third ceramic layer 4 is improved.

Furthermore, since the resistance of each of the first via conductor 7 and the second via conductor 8 is partially increased, in comparison with the case where the resistance of each of the first via conductor 7 and the second via conductor 8 is entirely increased, the fluctuation in the resistance of each of the first via conductor 7 and the second via conductor 8 does not easily occur. That is, the resistance of each of the first via conductor 7 and the second via conductor 8 can be easily set.

A method for fabricating the monolithic capacitor 1 will now be described below. First, ceramic green sheets and a conductive paste are prepared. The conductive paste is screen-printed in a predetermined pattern onto each of ceramic green sheets used for first ceramic layers 2 and second ceramic layers 3 out of the ceramic green sheets prepared. The predetermined pattern is a substantially rectangular electrode pattern in which openings 9 are provided like islands as shown in FIG. 1. Thus, patterns of first internal electrodes 5 and second internal electrodes 6 are formed.

Subsequently, a predetermined number of ceramic green sheets each having the pattern of the first internal electrode 5 or the second internal electrode 6 printed thereon are stacked, and a predetermined number of ceramic green sheets not having the pattern of the first internal electrode 5 or the second internal electrode 6 printed thereon are stacked only on the upper side. Thereby, a first mother laminate is formed. Furthermore, a predetermined number of ceramic green sheets used for third ceramic layers 4 are stacked to form a second mother laminate. The ceramic green sheets used for the third ceramic layers 4 are ceramic green sheets not having the pattern of the first internal electrode 5 or the second internal electrode 6 printed thereon. The first mother laminate and the second mother laminate will be each subjected to pressure-bonding from upper and lower sides in the lamination direction with an isostatic press or the like, as necessary.

Next, a plurality of via-holes are formed so as to pass through in the lamination direction in each of the first mother laminate and the second mother laminate. In this preferred embodiment, as shown in FIG. 1, the via-holes are arranged preferably in a dot matrix-like configuration.

Next, the via-holes are filled with conductive paste by screen-printing to form first via conductors 7 and secondvia conductors 8. Specifically, the via-holes of the first mother laminate are filled with a conductive paste having a relatively low metal oxide content, and the via-holes of the second mother laminate are filled with a conductive paste having a relatively high metal oxide content. On this occasion, preferably, a mask is placed on the principal surface of each of the first mother laminate and the second mother laminate so as to prevent the conductive paste from adhering to portions other than the via-holes. It is also preferable to suck the conductive paste from an end of the via-hole opposite to the end into which the conductive paste is filled so that the conductive paste is easily filled inside the via-hole. Then, the first mother laminate is laminated to the second mother laminate to obtain a mother laminate.

Next, the mother laminate is cut into a predetermined size to obtain a green ceramic laminate. The green ceramic laminate is fired in an atmosphere of air, nitrogen, or mixed gas of water vapor and nitrogen at about 900° C. to about 1,300° C., for example. Thereby, a fired laminate 18 is obtained.

Next, conductive paste is applied by screen-printing onto the upper surface 16 and the lower surface 17 of the laminate 18 to form patterns of first external electrodes 12, second external electrodes 13, third external electrodes 14, and fourth external electrodes 15. Then, the patterns are subject to baking in an atmosphere of air, nitrogen, or mixed gas of water vapor and nitrogen at about 700° C. to about 900° C., for example. As a result, the first external electrodes 12, the second external electrodes 13, the third external electrodes 14, and the fourth external electrode 15 are formed. According to need, the surface of each of the first external electrodes 12, the second external electrodes 13, the third external electrodes 14, and the fourth external electrodes 15 may be plated. By way of the steps described above, the monolithic capacitor 1 is completed.

As the binder and the solvent contained in the ceramic green sheets and the conductive pastes, any known organic binder and any known organic solvent can be used.

Second Preferred Embodiment

Figure 4:
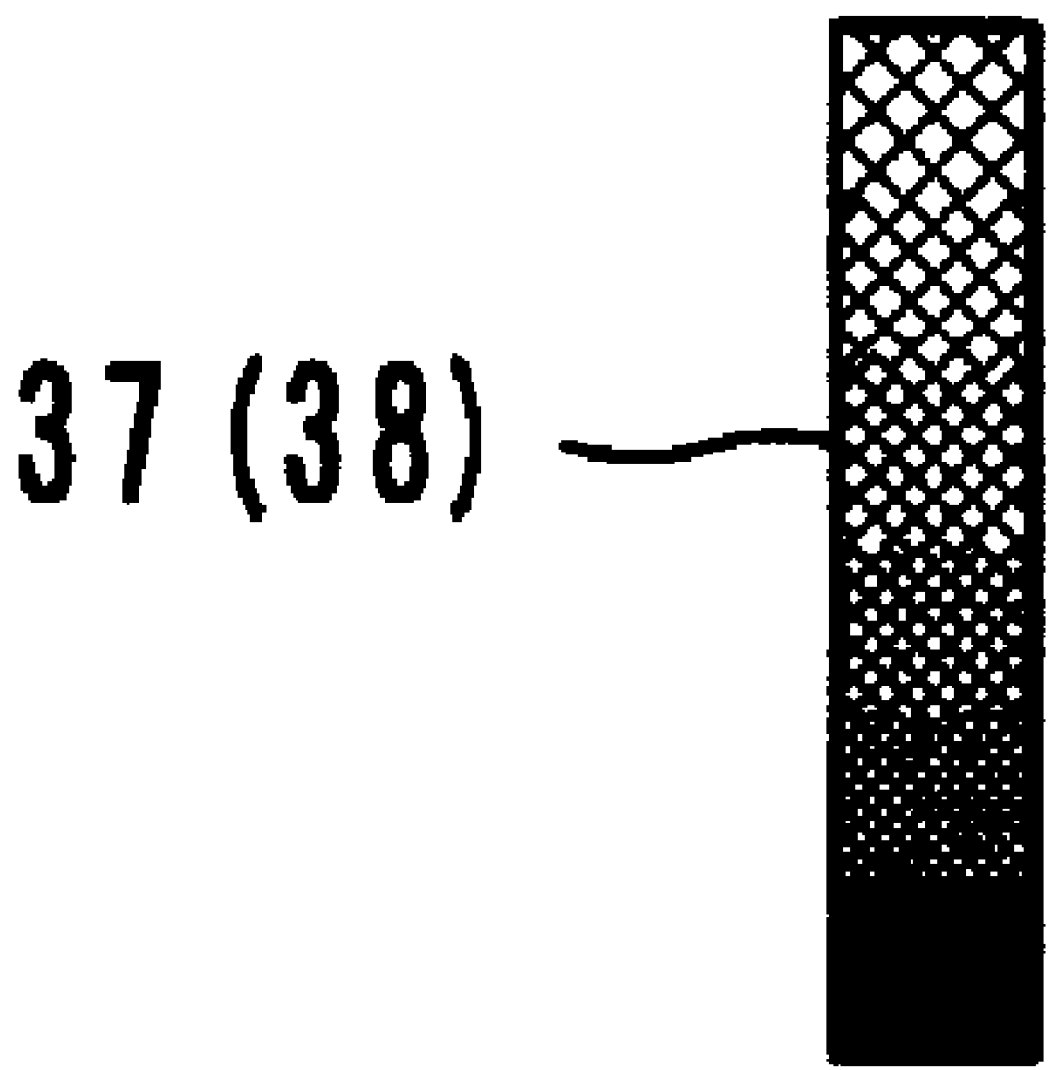
FIG. 4 is a schematic diagram showing the metal oxide content in each portion of each of the first via conductor and the second via conductor in a second preferred embodiment of the present invention.

The distribution of the metal oxide content in each of the first via conductor and the second via conductor may be as shown in FIG. 4. FIG. 4 is a schematic diagram showing the metal oxide content in each portion of each of a first via conductor 37 and a second via conductor 38 in a monolithic capacitor 31 according to a second preferred embodiment of the present invention.

Referring to FIG. 4, in each of the first via conductor 37 and the second via conductor 38, the metal oxide content increases from the end on the upper surface 16 side to the end on the lower surface 17 side. Thus, it is possible to decrease the resistance at the end on the upper surface 16 side of each of the first via conductor 37 and the second via conductor 38, and it is also possible to increase the resistance at the end on the lower surface 17 side of each of the first via conductor 37 and the second via conductor 38. Consequently, as in the first preferred embodiment, in the monolithic capacitor 31, the occurrence of ringing can be suppressed and electric power can be rapidly supplied to an IC.

A method for fabricating a monolithic capacitor 31 including the first via conductor 37 and the second via conductor 38 as those shown in FIG. 4 will now be described below. In this preferred embodiment, via-holes are formed using a laser or a NC punch press in a mother laminate in which ceramic green sheets are stacked. Then, conductive pastes having different metal oxide contents are continuously filled into the via-holes. Since subsequent steps are the same as those in the first preferred embodiment, an explanation thereof will be omitted.

Third Preferred Embodiment

Figure 5:
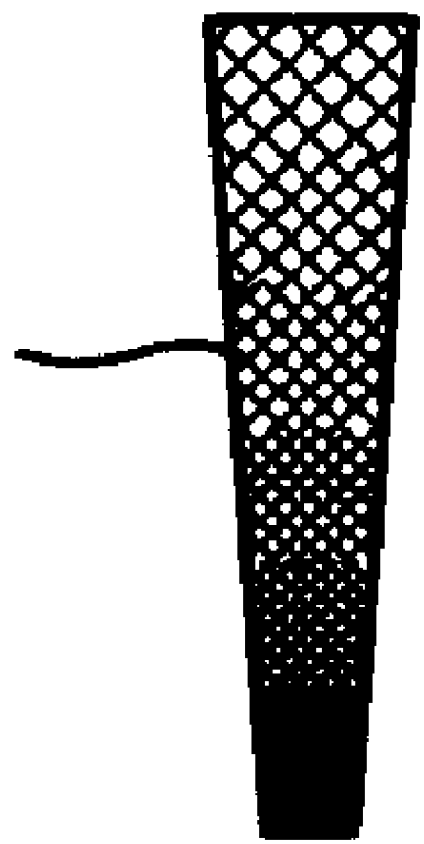
FIG. 5 is a schematic diagram showing a structure of a cross section and the metal oxide content in each portion of each of the first via conductor and the second via conductor in a third preferred embodiment of the present invention.

The shape of each of the first via conductor and the second via conductor may be the one as shown in FIG. 5. FIG. 5 is a schematic diagram showing a structure of a cross section and the metal oxide content in each portion of each of a first via conductor 47 and a second via conductor 48 in a monolithic capacitor 41 according to a third preferred embodiment.

Each of the first via conductor 47 and the second via conductor 48 has a shape in which the area of the cross-section perpendicular or substantially perpendicular to the lamination direction decreases from the end on the upper surface 16 side toward the end on the lower surface 17 side. More specifically, as shown in FIG. 5, each of the first via conductor 47 and the second via conductor 48 has a tapered shape in which the diameter gradually decreases from the end on the upper surface 16 side toward the end on the lower surface 17 side.

Furthermore, in each of the first via conductor 47 and the second via conductor 48, the metal oxide content increases from the end on the upper surface 16 side toward the end on the lower surface 17 side.

In such a structure, in comparison with the second preferred embodiment, in each of the first via conductor 47 and the second via conductor 48, the resistance at the end on the upper surface 16 side can be significantly decreased, and the resistance at the end on the lower surface 17 side can be significantly increased. Consequently, as in the first preferred embodiment, in the monolithic capacitor 41, the occurrence of ringing can be suppressed, and electric power can be rapidly supplied to an IC.

A method for fabricating a monolithic capacitor 41 including the first via conductor 47 and the second via conductor 48 as those shown in FIG. 5 will now be described below. In this preferred embodiment, via-holes are formed using a laser in a mother laminate in which ceramic green sheets are stacked. When the via-holes are formed, if a laser beam is applied from the upper side, the laser energy is attenuated from the upper side toward the lower ceramic layers. As a result, the cross-sectional area of the via-hole formed decreases toward the lower side in the lamination direction. Then, conductive pastes having different metal oxide contents are continuously filled into the via-holes. Since subsequent steps are the same as those in the first preferred embodiment, an explanation thereof will be omitted.

Fourth Preferred Embodiment

Figure 6:
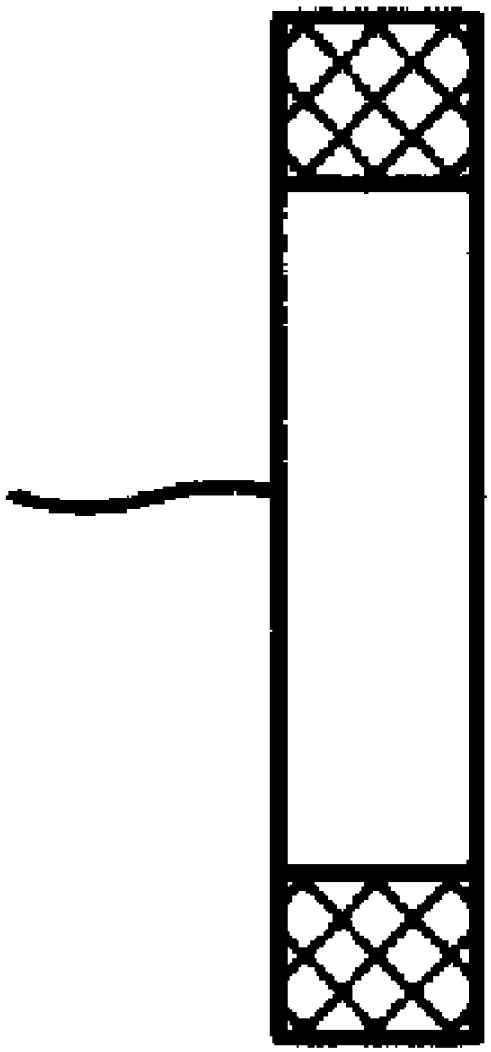
FIG. 6 is a schematic diagram showing the metal oxide content in each portion of each of the first via conductor and the second via conductor in a fourth preferred embodiment of the present invention.

The distribution of the metal oxide content in each of the first via conductor and the second via conductor may be as shown in FIG. 6. FIG. 6 is a schematic diagram showing the metal oxide content in each portion of each of a first via conductor 57 and a second via conductor 58 in a monolithic capacitor 51 according to a fourth preferred embodiment of the present invention.

Referring to FIG. 6, in each of the first via conductor 57 and the second via conductor 58, the metal oxide content at the end on the upper surface 16 side and the metal oxide content at the end on the lower surface 17 side are higher than the metal oxide content at the center. In such a case, electric power is supplied to an IC less rapidly than the monolithic capacitors 1, 31, and 41. However, in comparison with a monolithic capacitor in which each of the first via conductor and the second via conductor entirely has a high resistance, since the resistance is low at the center in the monolithic capacitor 51, a satisfactory effect can be obtained. Furthermore, in each of the first via conductor 57 and the second via conductor 58, the distribution of the metal oxide content is substantially symmetrical with respect to the center in the lamination direction. Thus, it is not necessary to distinguish the upper side from the lower side in the lamination direction in the monolithic capacitor 51. As a result, it is not necessary to use marking for specifying the upper or lower direction in the monolithic capacitor 51.

A method for fabricating a monolithic capacitor 51 including the first via conductor 57 and the second via conductor 58 as those shown in FIG. 6 will now be described below. The same steps as those in the first preferred embodiment are carried out until the patterns of first internal electrodes 5 and second internal electrodes 6 are printed on ceramic green sheets, and thus, an explanation thereof will be omitted.

Ceramic green sheets used for third ceramic layers 4 constituting a non-capacitance layer 20 are stacked to form a first mother laminate. Ceramic green sheets used for third ceramic layers 4 constituting a non-capacitance layer 22 are stacked to form a second mother laminate. Ceramic green sheets used for first ceramic layers 2 and second ceramic layers 3 constituting a capacitance layer 21 are stacked to form a third mother laminate.

Next, via-holes are formed in the first to third mother laminates as in the first preferred embodiment.

Next, the via-holes are filled with conductive paste by screen-printing to form first via conductors 57 and second via conductors 58. Specifically, the via-holes of the first mother laminate and the second mother laminate are filled with a conductive paste having a relatively high metal oxide content, and the via-holes of the third mother laminate are filled with a conductive paste having a relatively low metal oxide content. Then, the second mother laminate, the third mother laminate, and the first mother laminate are stacked in that order from the bottom in the lamination direction to obtain a mother laminate. Since subsequent steps are the same as those in the first preferred embodiment, an explanation thereof will be omitted.

Fifth Preferred Embodiment

Figure 7:
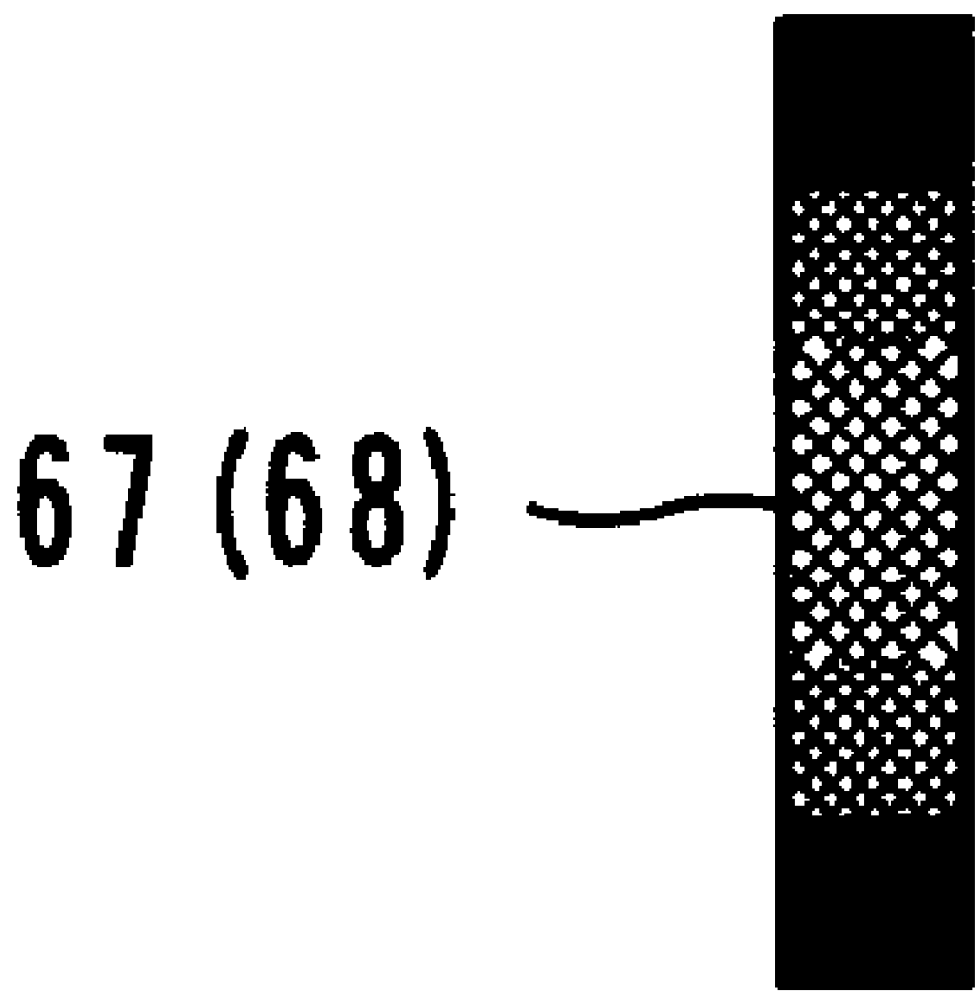
FIG. 7 is a schematic diagram showing the metal oxide content in each portion of each of the first via conductor and the second via conductor in a fifth preferred embodiment of the present invention.

The distribution of the metal oxide content in each of the first via conductor and the second via conductor may be as shown in FIG. 7. FIG. 7 is a schematic diagram showing the metal oxide content in each portion of each of a first via conductor 67 and a second via conductor 68 in a monolithic capacitor 61 according to a fifth preferred embodiment of the present invention.

Referring to FIG. 7, in each of the first via conductor 67 and the second via conductor 68, the metal oxide content decreases from the end on the upper surface 16 side toward the center and from the end on the lower surface 17 side toward the center. In such a case, as in the monolithic capacitor 51, electric power is supplied to an IC less rapidly than the monolithic capacitors 1, 31, and 41. However, in comparison with a monolithic capacitor in which each of the first via conductor and the second via conductor entirely has a high resistance, since the resistance is low at the center, a satisfactory effect can be obtained. Furthermore, in each of the first via conductor 67 and the second via conductor 68, the distribution of the metal oxide content is substantially symmetrical with respect to the center in the lamination direction. Thus, it is not necessary to distinguish the upper side from the lower side in the lamination direction in the monolithic capacitor 61. As a result, it is not necessary to use marking for specifying the upper or lower direction in the monolithic capacitor 61.

A method for fabricating a monolithic capacitor 61 including the first via conductor 67 and the second via conductor 68 as those shown in FIG. 7 will now be described below. The same steps as those in the first preferred embodiment are carried out until the patterns of first internal electrodes 5 and second internal electrodes 6 are printed on ceramic green sheets, and thus, an explanation thereof will be omitted.

Ceramic green sheets in an upper half in the lamination direction of a laminate to be formed are stacked to form a first mother laminate. Ceramic green sheets in a lower half in the lamination direction of the laminate to be formed are stacked to form a second mother laminate.

Next, via-holes are formed in the first mother laminate and the second mother laminate as in the first preferred embodiment.

Next, conductive pastes having different metal oxide contents are continuously filled into each of the via-holes of the first mother laminate and the via-holes in the second mother laminate. Then, the first mother laminate is laminated to the second mother laminate to obtain a mother laminate. Since subsequent steps are the same as those in the first preferred embodiment, an explanation thereof will be omitted.

Sixth Preferred Embodiment

Figure 8:
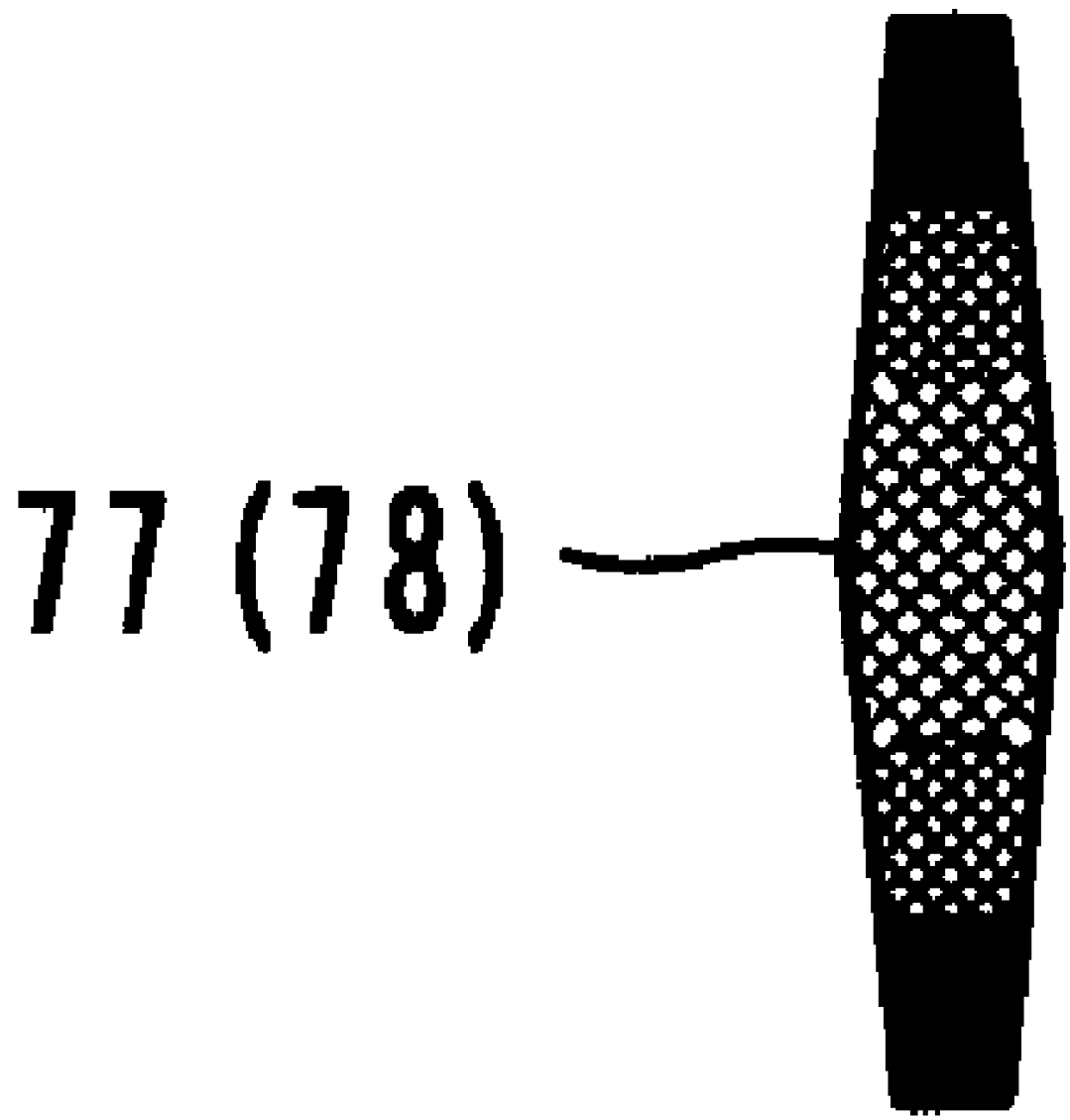
FIG. 8 is a schematic diagram showing a structure of a cross section and the metal oxide content in each portion of each of the first via conductor and the second via conductor in a sixth preferred embodiment of the present invention.

The shape of each of the first via conductor and the second via conductor may be the one as shown in FIG. 8. FIG. 8 is a schematic diagram showing a structure of a cross section and the metal oxide content in each portion of each of a first via conductor 71 and a second via conductor 78 in a monolithic capacitor 71 according to a sixth preferred embodiment of the present invention.

Each of the first via conductor 77 and the second via conductor 78 has a shape in which the area of the cross-section perpendicular or substantially perpendicular to the lamination direction increases from the end on the upper surface 16 side toward the center and from the end on the lower surface 17 side toward the center. More specifically, as shown in FIG. 8, each of the first via conductor 77 and the second via conductor 78 has a tapered shape in which the diameter gradually increases from the end on the upper surface 16 side toward the center and from the end on the lower surface 17 side toward the center.

Furthermore, in each of the first via conductor 77 and the second via conductor 78, the metal oxide content decreases from the end on the upper surface 16 side toward the center and from the end on the lower surface 17 side toward the center.

In such a structure, in comparison with the fifth preferred embodiment, in each of the first via conductor 77 and the second via conductor 78, the resistance can be significantly increased at the end on the upper surface 16 side and at the end on the lower surface 17 side. Consequently, as in the first preferred embodiment, in the monolithic capacitor 71, the occurrence of ringing can be suppressed and electric power can be rapidly supplied to an IC.

A method for fabricating a monolithic capacitor 71 including the first via conductor 77 and the second via conductor 78 as those shown in FIG. 8 will now be described below. The same steps as those in the first preferred embodiment are carried out until the patterns of first internal electrodes 5 and second internal electrodes 6 are printed on ceramic green sheets, and thus, an explanation thereof will be omitted.

Next, ceramic green sheets in an upper half in the lamination direction of a laminate to be formed are stacked to form a first mother laminate. Ceramic green sheets in a lower half in the lamination direction of the laminate to be formed are stacked to form a second mother laminate.

Next, via-holes are formed using a laser in the first mother laminate and the second mother laminate. When the via-holes are formed in the first mother laminate, if a laser beam is applied from the lower side, the laser energy is attenuated from the lower side toward the upper side in the lamination direction. Similarly, when the via-holes are formed in the second mother laminate, if a laser beam is applied from the upper side, the laser energy is attenuated from the upper side toward the lower side in the lamination direction. As a result, the cross-sectional area of the via-holes formed decreases from the center toward the end on the upper side and from the center toward the end on the lower side in the lamination direction.

Next, conductive pastes having different metal oxide contents are continuously filled into each of the via-holes of the first mother laminate and the via-holes in the second mother laminate. Then, the first mother laminate is laminated to the second mother laminate to obtain a mother laminate. Since subsequent steps are the same as those in the first preferred embodiment, an explanation thereof will be omitted.

Seventh Preferred Embodiment

Figure 9:
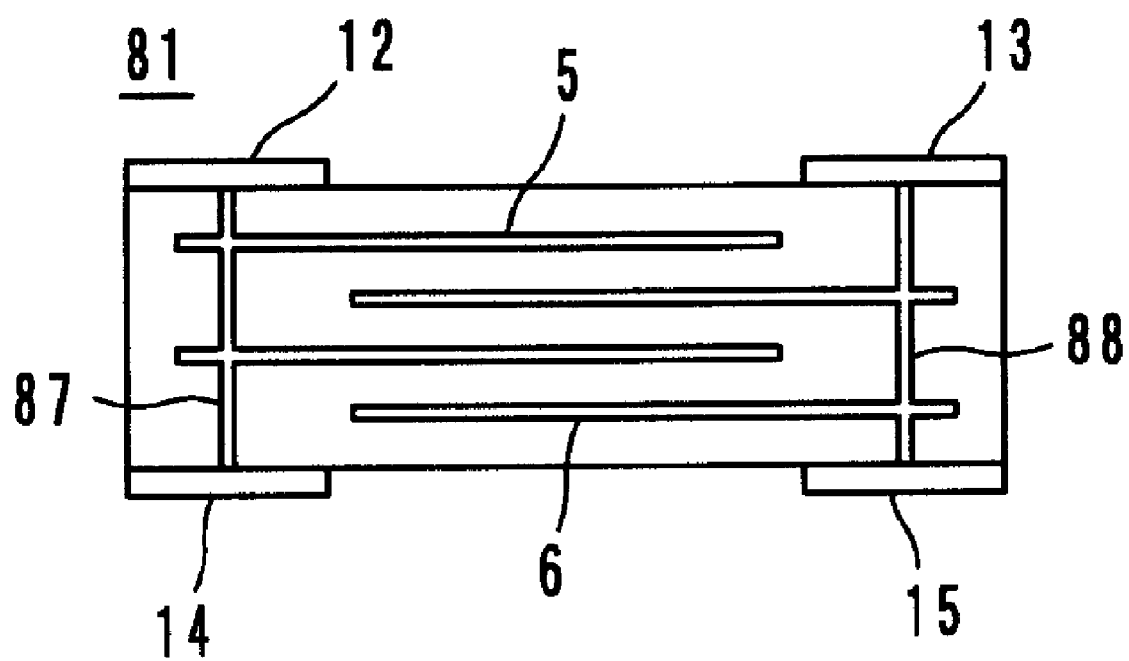
FIG. 9 is a cross-sectional view showing a structure of a monolithic capacitor according to a seventh preferred embodiment of the present invention.

In each of the first to sixth preferred embodiments described above, the first via conductors and the second via conductors are arranged in a dot matrix-like configuration. However, the placement of the first via conductors and the second via conductors is not limited thereto. As in a monolithic capacitor 81 shown in FIG. 9, one first via conductor 87 and one second via conductor 88 may be provided.

Eighth Preferred Embodiment

Figure 10:
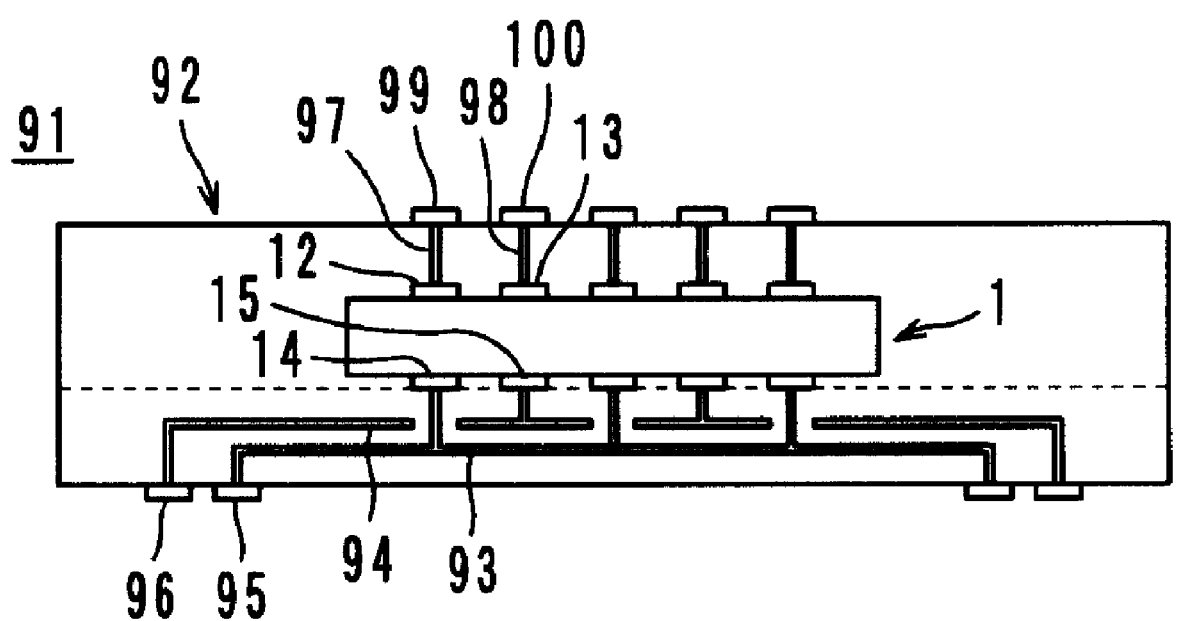
FIG. 10 is a cross-sectional view showing a structure of a circuit board according to an eighth preferred embodiment of the present invention.

A circuit board including a monolithic capacitor 1 according to the first preferred embodiment will be described with reference to the drawings. FIG. 10 is a cross-sectional view showing a structure of a circuit board 91 including the monolithic capacitor 1.

The circuit board 91 includes the monolithic capacitor 1, a substrate 92, a first line 93, a second line 94, a grounding terminal 95, a power terminal 96, third lines 97, fourth lines 98, first external terminals 99, and second external terminals 100.

The substrate 92 has a structure in which insulating layers made of a resin are stacked. The grounding terminal 95 is disposed on the lower surface of the substrate 92, and a ground potential is applied to the grounding terminal 95. The power terminal 96 is disposed on the lower surface of the substrate 92, and a power supply voltage is applied to the power terminal 96.

The first line 93 is disposed inside the substrate 92 and electrically connects between the grounding terminal 95 and third external electrodes 14 of the monolithic capacitor 1. The second line 94 is disposed inside the substrate 92 and electrically connects between the power terminal 96 and the fourth external electrodes 15 of the monolithic capacitor 1.

The monolithic capacitor 1 is mounted on the substrate 92 such that the ends having a high metal oxide content are connected to the first line 93 and the second line 94. Specifically, as shown in FIG. 10, the monolithic capacitor 1 is mounted on the substrate 92 such that the third external electrodes 14 and the fourth external electrodes 15 are located on the lower side in the lamination direction.

The third line 97 is disposed inside the substrate 92 and electrically connects between the corresponding first external electrode 12 and the corresponding first external terminal 99. The fourth line 98 is disposed inside the substrate 92 and electrically connects the corresponding second external electrode 13 and the corresponding second external terminal 100. The first external terminals 99 are disposed on the upper surface of the substrate 92 and supply a grounding potential to an IC to be mounted on the circuit board 91. The second external terminals 100 are disposed on the upper surface of the substrate 92 and supply a power supply voltage to the IC to be mounted on the circuit board 91.

A method for fabricating a circuit board 91 having the structure described above will be described below. A resin substrate, which corresponds to a portion below the dotted line in the circuit board 91 shown in FIG. 10, is prepared. The monolithic capacitor 1 is mounted on the resin substrate.

Next, a prepreg sheet containing an uncured thermosetting resin is placed over the monolithic capacitor 1 and pressure is applied from above in the lamination direction. Then, the prepreg sheet is cured by heating.

Next, via-holes are formed in the upper surface of the substrate 92. The via-holes are filled with a conductive resin containing metal powder, such as Cu, and a thermosetting resin, such as an epoxy resin, to form the third lines 97 and the fourth lines 98. The third lines 97 and the fourth lines 98 may be formed by via filling, in which the via-holes are filled with a metal by plating.

Next, the first external terminals 99 and the second external terminals 100 are formed by etching a metal foil, such as Cu. The first external terminals 99 and the second external terminals 100 may be bumps made of Au or a conductive resin formed directly on the third lines 97 and the fourth lines 98.

In the eighth preferred embodiment described above, the monolithic capacitor 1 is mounted on the circuit board 91. Any of the monolithic capacitors 31, 41, 51, 61, 71, and 81 may be mounted on the circuit board 91.

Ninth Preferred Embodiment

Figure 11:
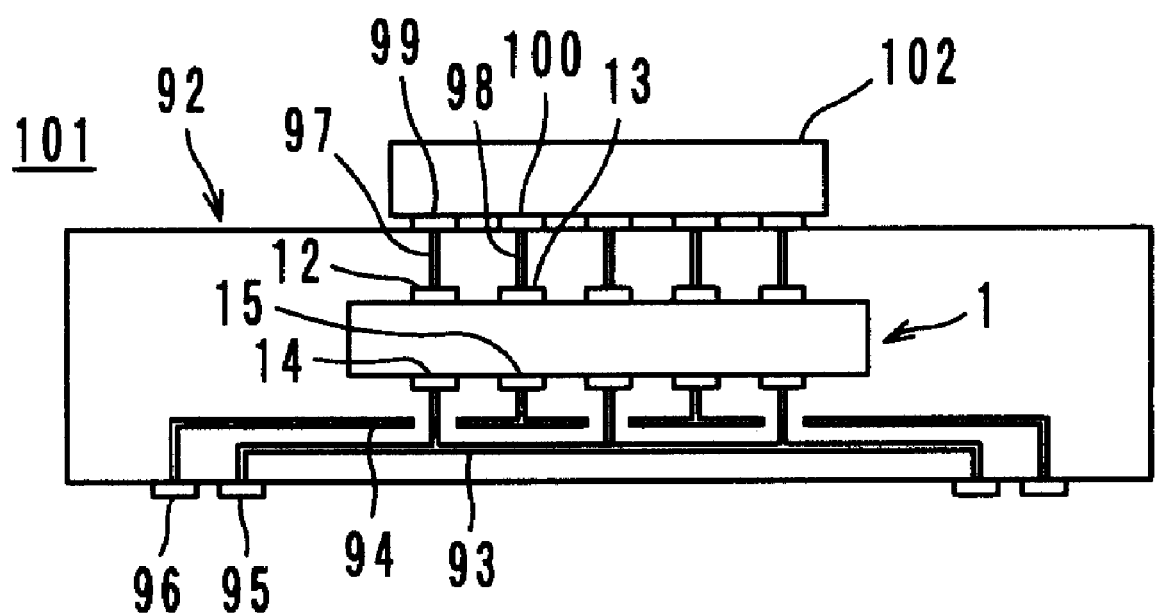
FIG. 11 is a cross-sectional view showing a structure of a circuit module according to a ninth preferred embodiment of the present invention.
Figure 12:
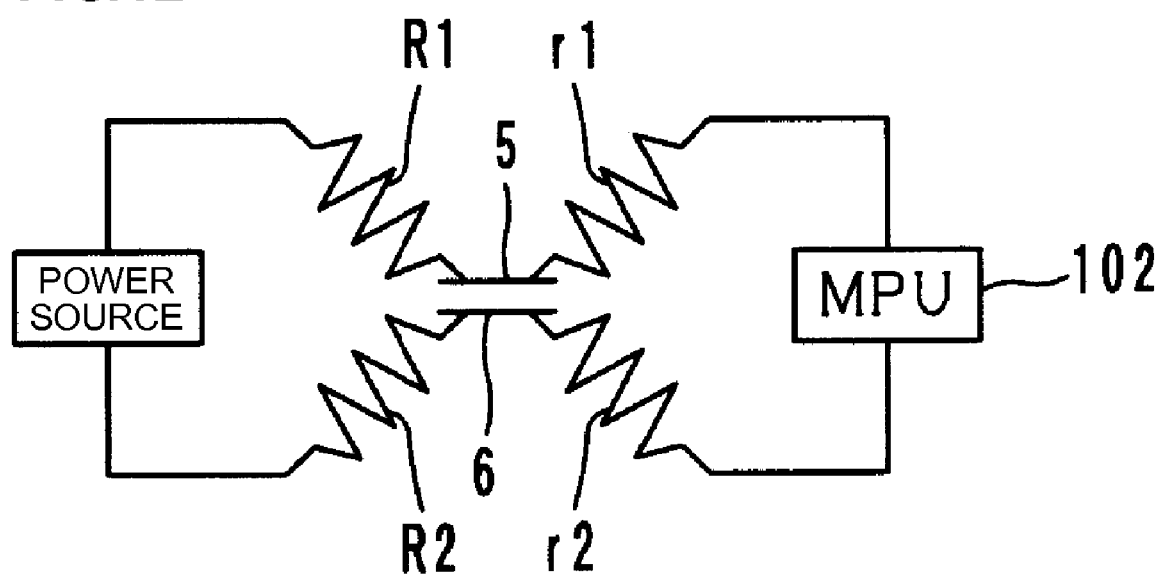
FIG. 12 is an equivalent circuit diagram of the circuit module shown in FIG. 11.

FIG. 11 is a cross-sectional view showing a structure of a circuit module 101 according to a ninth preferred embodiment. FIG. 12 is an equivalent circuit diagram of the circuit module 101.

As shown in FIG. 11, in the circuit module 101, a MPU 102 as an IC is mounted on a circuit board 92. As shown in FIG. 12, a capacitor including a first internal electrode 5 and a second internal electrode 6, high resistors R1 and R2, and low resistors r1 and r2 are present between the MPU 102 and a power source. Specifically, the high resistors R1 and R2 are connected between one end of the power source and the first internal electrode 5 and between the other end of the power source and the second internal electrode 6, respectively. The low resistors r1 and r2 are connected between one end of the MPU 102 and the first internal electrode 5 and between the other end of the MPU 102 and the second internal electrode 6, respectively.

Since the circuit module 101 has the equivalent circuit described above, the resistance is high between the power source and the monolithic capacitor 1, and ringing is suppressed. On the other hand, since the resistance is low between the MPU 102 and the monolithic capacitor 1, current easily flows from the monolithic capacitor 1 to the MPU 102, and electric power can be rapidly supplied to the MPU 102.

Tenth Preferred Embodiment

Figure 13:
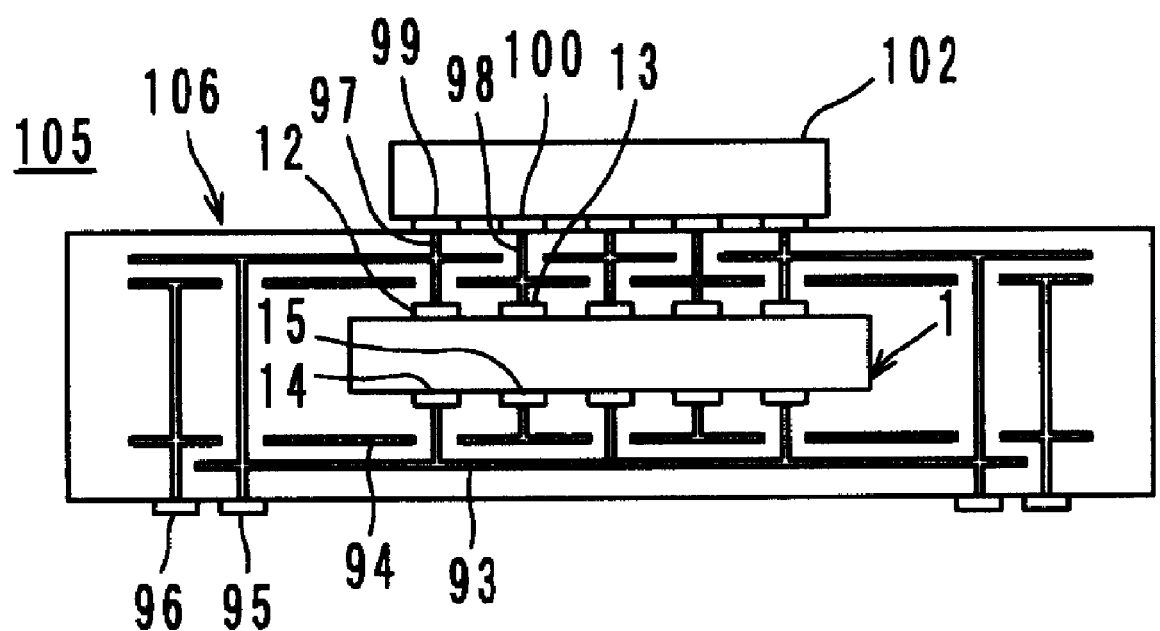
FIG. 13 is a cross-sectional view showing a structure of a circuit module according to a tenth preferred embodiment of the present invention.
Figure 14:
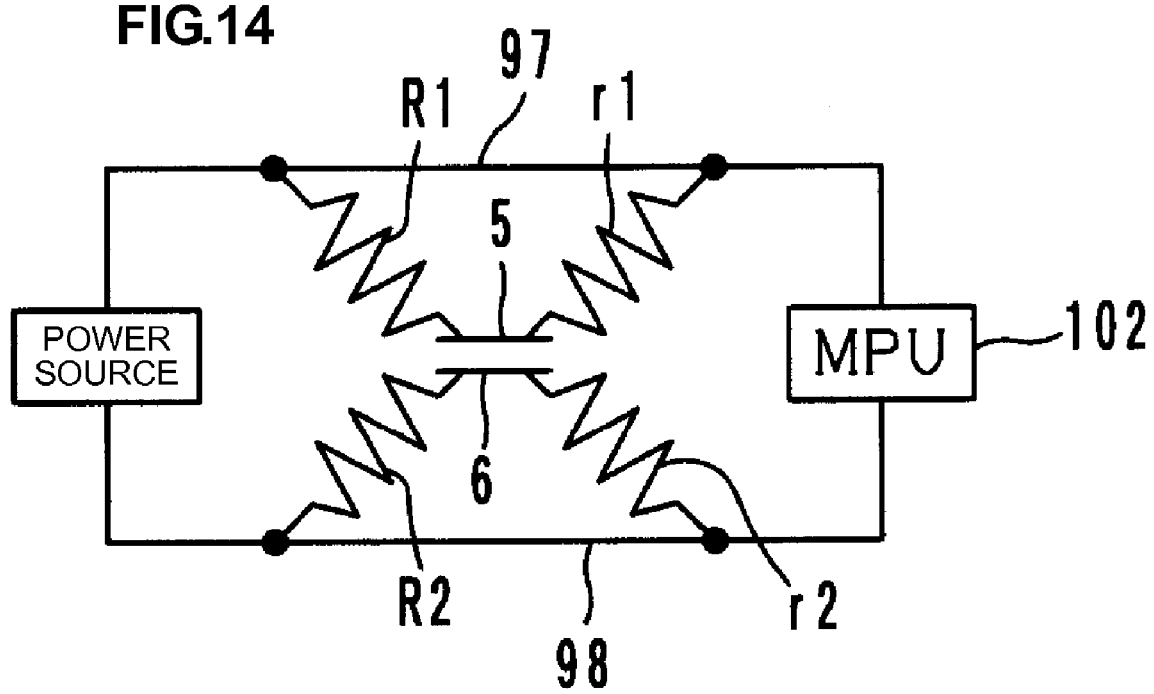
FIG. 14 is an equivalent circuit diagram of the circuit module shown in FIG. 13.

FIG. 13 is a cross-sectional view showing a structure of a circuit module 105 according to a tenth preferred embodiment. FIG. 14 is an equivalent circuit diagram of the circuit module 105.

A third line 97 of the circuit module 105 is connected to a grounding terminal 95, and a fourth line 98 is connected to a power terminal 96. The equivalent circuit of the circuit module 105 is shown in FIG. 14. Specifically, a power source and a MPU 102 are directly connected via the third line 97 and the fourth line 98.

In the circuit module 105 having the structure described above, since the resistance is low between the power source and the MPU 102, the current loss at high resistance is reduced.

Eleventh Preferred Embodiment

Figure 15:
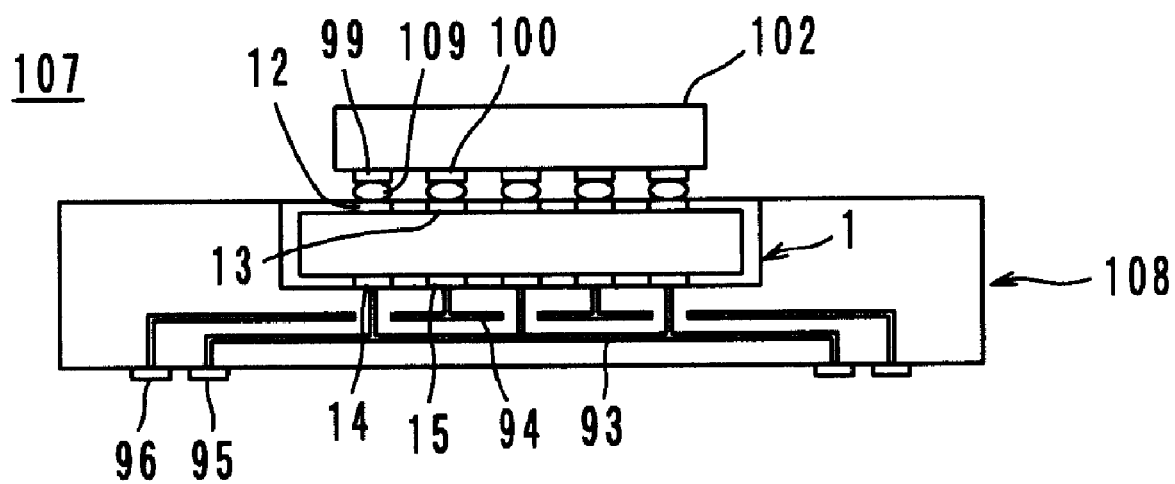
FIG. 15 is a cross-sectional view showing a structure of a circuit module according to an eleventh preferred embodiment of the present invention.
Figure 16:
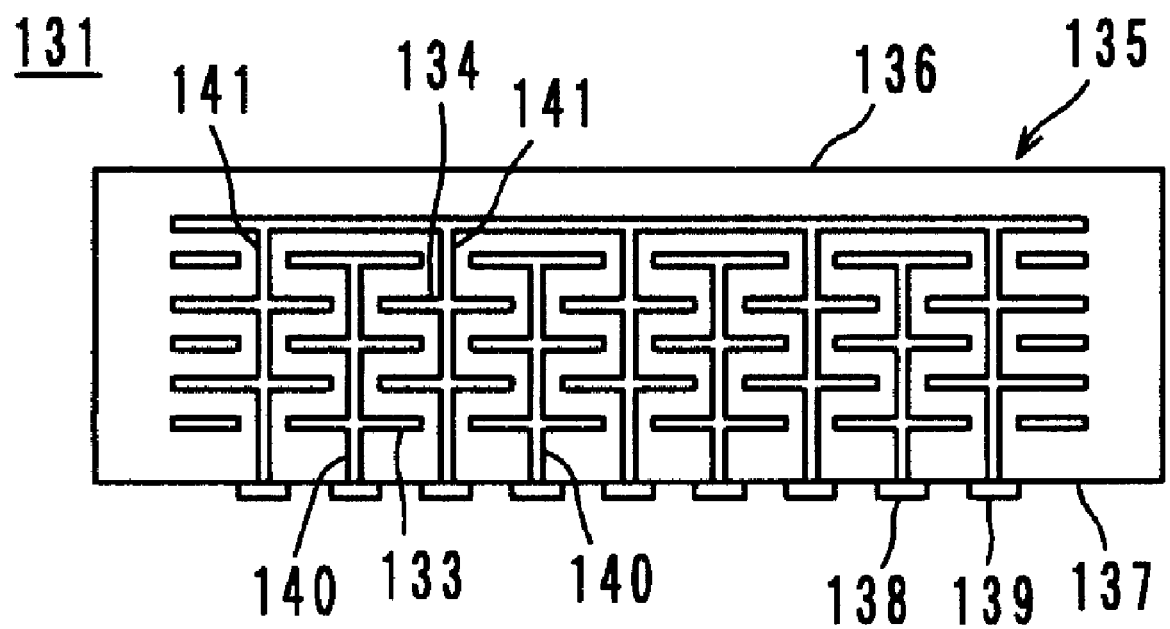
FIG. 16 is a cross-sectional view showing a structure of a known monolithic capacitor.

FIG. 15 is a cross-sectional view showing a structure of a circuit module 107 according to an eleventh preferred embodiment of the present invention. As shown in FIG. 15, a recess may be formed in a substrate 108 so that a monolithic capacitor 1 is mounted in the recess. In such a case, a MPU 102 may be mounted on the monolithic capacitor 1 with bumps 109 therebetween.

Other Preferred Embodiments

In the monolithic capacitors 1, 31, 41, 51, 61, 71, and 81, each of the first and second via conductors may have a portion in which a metal oxide is not mixed.

While preferred embodiments of the invention have been described above, it is to be understood that variations and modifications will be apparent to those skilled in the art without departing the scope and spirit of the invention. The scope of the invention, therefore, is to be determined solely by the following claims.

What is claimed is:

1. A monolithic capacitor comprising:
    a laminate including a plurality of ceramic layers, the laminate having a first surface and a second surface opposing the first surface;
    at least one pair of first and second internal electrodes opposed to each other with one of the ceramic layers disposed therebetween;
    a first external electrode and a second external electrode disposed on the first surface;
    a third external electrode and a fourth external electrode disposed on the second surface;
    a first via conductor arranged to electrically connect the first external electrode to the first internal electrode and to the third external electrode, that extends between the first surface and the second surface, and that is made of a material including a metal oxide, wherein the metal oxide content at an end on the second surface side of the first via conductor is higher than at least one of the metal oxide content at a center and the metal oxide content at an end on the first surface side of the first via conductor; and
    a second via conductor arranged to electrically connect the second external electrode to the second internal electrode and to the fourth external electrode, that extends between the first surface and the second surface, and that is made of a material containing a metal oxide, wherein the metal oxide content at an end on the second surface side of the second via conductor is higher than at least one of the metal oxide content at a center and the metal oxide content at an end on the first surface side of the second via conductor.

2. The monolithic capacitor according to claim 1, wherein, in the first via conductor, the metal oxide content at the end on the second surface side is higher than the metal oxide content at the center and at the end on the first surface side, and in the secondvia conductor, the metal oxide content at the end on the second surface side is higher than the metal oxide content at the center and at the end on the first surface side.

3. The monolithic capacitor according to claim 1, wherein the first via conductor has a shape in which the cross-sectional area increases from the end on the second surface side toward the end on the first surface side, and the second via conductor has a shape in which the cross-sectional area increases from the end on the second surface side toward the end on the first surface side.

4. The monolithic capacitor according to claim 1, wherein the laminate includes a capacitance layer that contributes to formation of capacitance and non-capacitance layers that do not contribute to formation of capacitance, the capacitance layer being sandwiched between the non-capacitance layers in the lamination direction, and the end on the second surface side of the first via conductor and the end on the second surface side of the second via conductor respectively correspond to a portion of the first via conductor passing through the non-capacitance layer on the second surface side and a portion of the second via conductor passing through the non-capacitance layer on the second surface side.

5. The monolithic capacitor according to claim 1, wherein, in the first via conductor, the metal oxide content at the end on the first surface side is higher than the metal oxide content at the center, and in the second via conductor, the metal oxide content at the end on the first surface side is higher than the metal oxide content at the center.

6. The monolithic capacitor according to claim 5, wherein the first via conductor has a shape in which the cross-sectional area increases from each of the end at the first surface side and the end at the second surface side toward the center, and the second via conductor has a shape in which the cross-sectional area increases from each of the end at the first surface side and the end at the second surface side toward the center.

7. The monolithic capacitor according to claim 5, wherein the laminate includes a capacitance layer that contributes to formation of capacitance and non-capacitance layers that do not contribute to formation of capacitance, the capacitance layer being sandwiched between the non-capacitance layers in the lamination direction, and the center of the first via conductor and the center of the second via conductor respectively correspond to a portion of the first via conductor passing through the capacitance layer and a portion of the second via conductor passing through the capacitance layer.

8. The monolithic capacitor according to claim 1, wherein the metal oxide contained in each of the first via conductor and the second via conductor is a ceramic that belongs to the same material system as that of a ceramic constituting the ceramic layers.

9. A circuit board comprising:
    a substrate made of an insulating material;
    a plurality of input terminals disposed on a surface of the substrate;
    a plurality of lines electrically connected to the input terminals; and
    the monolithic capacitor according to claim 1; wherein
    the monolithic capacitor is mounted on the substrate with the plurality of lines being electrically connected to the third external electrode and the fourth external electrode.

10. A circuit module comprising:
    the circuit board according to claim 9; and
    a semiconductor integrated circuit mounted on the circuit board; wherein
    the monolithic capacitor and the semiconductor integrated circuit are electrically connected to each other through the first external electrode and the second external electrode.

* * * * *